US005977713A

United States Patent [19]

Ochiai et al.

[11] Patent Number: 5,977,713

[45] Date of Patent: Nov. 2, 1999

[54] HIGH VOLTAGE NOISE FILTER AND MAGNETRON DEVICE USING IT

[75] Inventors: Hiroshi Ochiai, Kawachi-gun; Mitsuichi Hiraishi, Utsunomiya; Masanori Yoshihara, Imaichi; Yasunobu Nakano, Utsunomiya, all of Japan

[73] Assignee: Matsushita Electronics Corporation, Osaka, Japan

[21] Appl. No.: 08/827,079

[22] Filed: Mar. 26, 1997

[30] Foreign Application Priority Data

Mar. 27, 1996 [JP] Japan .................................... 8-072915

[51] Int. Cl.[6] ............................... H01J 23/15; H03H 7/01

[52] U.S. Cl. ......................... 315/39.51; 333/181; 333/185

[58] Field of Search ..................................... 333/181, 185, 333/177; 315/39.51, 39.53, 85; 219/715, 718, 738, 761

[56] References Cited

U.S. PATENT DOCUMENTS

| | | | |
|---|---|---|---|
| 2,841,771 | 7/1958 | Dunleavey | 333/181 |
| 3,727,098 | 4/1973 | Crapuchettes | 315/39.53 X |
| 3,732,459 | 5/1973 | Oguro et al. | 315/39.53 X |
| 3,859,558 | 1/1975 | Harada et al. | 333/181 X |
| 5,412,357 | 5/1995 | Nakamura et al. | 333/181 |

FOREIGN PATENT DOCUMENTS

| | | | |
|---|---|---|---|
| 0 440 865 A1 | 8/1991 | European Pat. Off. . | |
| 0 696 878 A2 | 2/1996 | European Pat. Off. . | |
| 55-77370 | 6/1980 | Japan | 333/185 |
| 6-112752 | 4/1994 | Japan . | |
| 7-7220 | 1/1995 | Japan . | |
| 7-15127 | 4/1995 | Japan . | |
| 1 372 476 | 10/1974 | United Kingdom . | |

OTHER PUBLICATIONS

Commerical Abstract for Japanese Patent No. 57001214, published Jan. 6, 1982.

*Primary Examiner*—Seungsook Ham
*Attorney, Agent, or Firm*—Sheridan Ross P.C.

[57] ABSTRACT

A high voltage noise filter for use in magnetron devices comprises a coil of a conductive wire coated with an insulating layer and another coil of the conductive wire with a conductive layer formed on the insulating layer, the two coils connected to each other in series A joint portion of the two coils has a triple-layered structure wherein a high withstand voltage layer either of a semiconductive or insulative member is formed in the vicinity of an end portion of the conductive layer, as interposed between the outer peripheral surface of the insulating layer and the conductive layer.

15 Claims, 10 Drawing Sheets

SECTIONAL VIEW ON LINE V--V

SECTIONAL VIEW ON LINE VI--VI

HIGH VOLTAGE NOISE FILTER AND MAGNETRON DEVICE USING IT

BACKGROUND OF THE INVENTION

The present invention relates to a high voltage noise filter for use in microwave devices and a magnetron device incorporating such a high voltage noise filter.

FIG. 10 is a bottom end view illustrating a relevant portion of a magnetron incorporating a conventional high voltage noise filter 1. In the figure, stem terminals 5*a* and 5*b* are connected with conductive wires 2*a* and 2*b* partially wound into coils, respectively, for prevention of leakage of fundamental wave noise and higher harmonic noise from the respective stem terminals 5*a* and 5*b* of the magnetron. The conductive wires 2*a* and 2*b* are coated with an insulating material along the overall length thereof except for end portions 30*a* and 30*b* connected with the respective stem terminals 5*a* and 5*b*. At coil portions defining choke coils 4*a* and 4*b,* and the conductive wires 2*a* and 2*b* are coated with insulating layers 1*a* and 1*b*. At the other coil portions 3*a* and 3*b* of the respective conductive wires 2*a* and 2*b,* conductive layers 34*a* and 34*b,* shown by diagonal hatching, are formed on the aforesaid insulating layers 1*a* and 1*b*. The conductive wires 2*a* and 2*b* have only the insulating layers 1*a* and 1*b* at end portions 31*a* and 31*b* of the coil portions 3*a* and 3*b,* and terminals thereof are connected to respective fastening tabs (terminals) 7*a* and 7*b* to be connected to a microwave source 6. The coil portions 3*a* and 3*b* are accommodated in cylindrical conductive members 8*a* and 8*b,* respectively. The conductive layers 34*a* and 34*b* electrically contact the interior walls of the respective cylindrical conductive members 8*a* and 8*b* and the coil portions 3*a* and 3*b* are mechanically secured in the respective cylindrical conductive members 8*a* and 8*b*. FIG. 10 shows a cross-section of the cylindrical conductive members 8*a* and 8*b* for illustration of the coil portions 3*a* and 3*b*. The cylindrical conductive members 8*a* and 8*b* are accommodated in resin casings 16*a* and 16*b*. Within the resin casings 16*a* and 16*b,* the conductive members 8*a* and 8*b* accommodating the coil portions 3*a* and 3*b,* the terminal portions 31*a* and 31*b* and joints between the fastening tabs 7*a* and 7*b* and the terminal portions 31*a* and 31*b* are filled with an insulating resin material 11. The conductive members 8*a* and 8*b* are electrically connected with a filter casing 10 by way of grounding plates 9.

In the high voltage noise filter of such a construction, the insulating layers 1*a* and 1*b* formed on the outer peripheral surfaces of the conductive wires 2*a* and 2*b* exert a significant influence on the withstand voltage characteristics of the high voltage noise filter. Particularly, terminal regions 1*e* and 1*f* of the coil portions 3*a* and 3*b* may sometimes suffer an abnormal increase in the electric field strength in the vicinity of the end portions of the conductive layers 34*a* and 34*b,* which increase in the electric field strength tends to cause insulation breakdown near the end portions of the conductive layers. The prevention of the insulation breakdown requires an increase in the withstand voltage characteristics of the insulating layers 1*a* and 1*b* of the conductive materials 2*a* and 2*b*. Unfortunately, an increase in the withstand voltage characteristics requires the insulating layers 1*a* and 1*b* to have an extreme thickness. An increased thickness of the insulating layers 1*a* and 1*b* leads to an increased size of the coil portions 3*a* and 3*b*. This results in not only a larger size of the high voltage noise filter but also decrease in the capacitance between the outer peripheral surfaces of the coil portions 3*a* and 3*b* and the conductive wires 2*a* and 2*b*. Consequently, the noise filter suffers a serious deterioration of the characteristics thereof.

BRIEF SUMMARY OF THE INVENTION

In view of the foregoing, the present invention is directed to relaxation of concentration of the aforesaid electric field in the vicinity of the end portions of the conductive layers without increasing the thickness of the insulating layers 1*a* and 1*b* thereby improving the withstand voltage characteristics of the high voltage noise filter. The present invention has been made through experimental study and development after many experiments on examples.

A high voltage noise filter in accordance with the invention comprises a coil-shaped conductive wire for producing an inductive component, an insulating layer for producing a capacitance component formed on the surface of the conductive wire, and a conductive layer formed on at least a part of the insulating layer by means of spraying or depositing a metal material. The capacitance component is produced by the conductive wire, insulating layer and conductive layer.

The high voltage noise filter further comprises a high withstand voltage layer comprising either a semiconductive layer or an insulative member layer, and the high withstand voltage layer is formed at least in the vicinity of an end portion of the conductive layer as interposed between the outer peripheral surface of the insulating layer and the conductive layer.

This reduces the electric field concentration in the vicinity of the end portion of the conductive layer. As a result, the insulating layer is improved in the withstand voltage characteristics thereof for enhancing the reliability. In addition, the insulating layer can be reduced in thickness, thus providing a high voltage noise filter of small size at low costs.

In another aspect of the high voltage noise filter in accordance with the invention, the coil-shaped conductive wire comprising the conductive layer is accommodated in a cylindrical conductive member.

By virtue of the accommodation of the coil-shaped conductive wire in the cylindrical conductive member, the conductive layer formed on the outer periphery of the insulating layer is in contact with the interior wall of the cylindrical conductive member, defining multiple contacting portions therewith. As a result, the conductive layer and a grounding plate are connected with each other at a low resistance thorough the cylindrical conductive member electrically connected to the grounding plate, a potential of the conductive layer lowers and the electric field concentration in the vicinity of the end portion of the conductive layer is further relaxed. Therefore the insulating layer of the coil-shaped conductive wire is notably improved in the withstand voltage characteristics, resulting in an enhanced reliability.

In yet another aspect of the high voltage noise filter in accordance with the invention, the aforesaid semiconductive layer comprises a material ranging from $10^{-4}$ to $10^{6}$ Ωm in electric resistivity.

The electric field strength in the vicinity of the end portion of the conductive layer is reduced by employing the semiconductive layer ranging from $10^{-4}$ to $10^{6}$ Ωm in electric resistivity as the high withstand voltage layer.

In yet another aspect of the high voltage noise filter in accordance with the invention, the aforesaid insulative member comprises a polyimide resin material.

The electric field strength in the vicinity of the end portion of the conductive layer is reduced by forming the high withstand voltage layer of the polyimide resin material.

In still another aspect of the high voltage noise filter in accordance with the invention, the aforesaid insulative member comprises a silicone resin material.

The electric field strength in the vicinity of the end portion of the conductive layer is reduced by forming the high withstand voltage layer of the silicone resin material.

A magnetron device in accordance with the invention incorporates a high voltage noise filter comprising a coil-shaped conductive wire for producing an inductive component, an insulating layer for producing a capacitance component formed on the surface of the conductive wire, a conductive layer partially formed on the insulating layer, and a high withstand voltage layer comprising either a semiconductive layer or an insulative member layer formed at least in the vicinity of an end portion of the conductive layer as interposed between the outer peripheral surface of the insulating layer and the conductive layer.

The magnetron device of the invention is improved in reliability because of the incorporation of the high voltage noise filter improved in the withstand voltage characteristics, the noise filter characterized by the high withstand voltage layer formed in the vicinity of the end portion of the conductive layer of the coil-shaped conductive wire as interposed between the outer peripheral surface of the insulating layer and the conductive layer.

In another aspect of the magnetron device in accordance with the invention, a magnetron device incorporates a high voltage noise filter wherein the coil-shaped conducive wire having the insulating layer and conductive layer is accommodated in a cylindrical conductive member.

The high voltage noise filter can achieve a significant improvement in the withstand voltage characteristics by way of accommodation of the coil-shaped conductive wire in the cylindrical conductive member and hence, the magnetron device incorporating such a high voltage noise filter is notably improved in the reliability.

DETAILED DESCRIPTION OF THE INVENTION

Preferred embodiments of the invention will be described in detail with reference to FIG. 1 through FIG. 9.

First Embodiment

Figure 1:
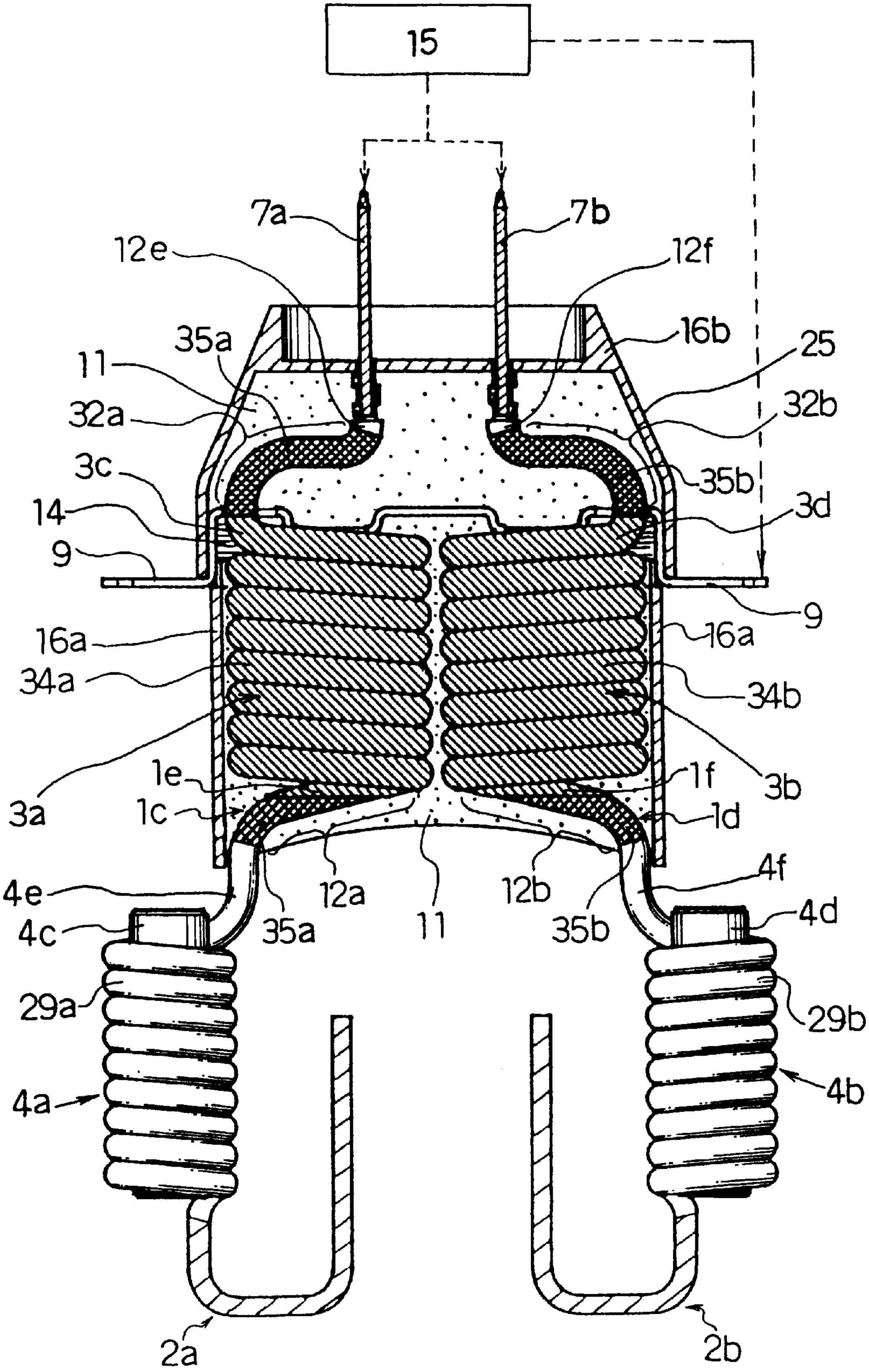
FIG. 1 is a top plan view illustrating a relevant portion of a high voltage noise filter in accordance with a first embodiment of the invention.

FIG. 1 is a top plan view illustrating a high voltage noise filter in accordance with a first embodiment of the invention. In the figure, conductive wires 2*a* and 2*b* for producing an inductive component of an impedance are formed of a copper or aluminum wire having a diameter of from 1 to 2 mm. The conductive wires 2*a* and 2*b* are of a bare wire free of an insulative coating at portions shown by rough hatching for connection with unillustrated stem terminals of a magnetron. The conductive wires 2*a* and 2*b* were coated with a 30 to 500 μm thick, preferably about 300 μm thick, insulating layer formed of a heat-resistant resin material e.g. fluororesin. Other material such as polyimide resin, silicone resin or the like, may be also used similarly, thus constituting coated wires 29*a* and 29*b*. Choke coils 4*a* and 4*b* were formed of 15 to 25mm-long coated wires 29*a* and 29*b* wound into coils 10 to 20 mm in outer diameter. The choke coils 4*a* and 4*b* receive cores 4*c* and 4*d*, such as formed of ferrite, in hollow portions thereof, respectively.

Coil portions 3*a* and 3*b* formed of the coated wires extending via terminal portions 4*e* and 4*f* of the choke coils 4*a* and 4*b* have a greater outer diameter than the choke coils 4*a* and 4*b*. At the coil portions 3*a* and 3*b*, the coated wires 29*a* and 29*b* have conductive layers 34*a* and 34*b* formed further on the coatings of a heat-resistant, which is similar to the above-mentioned resin, such as fluororesin. The conductive layers 34*a* and 34*b* were formed by spraying or depositing at least one type of metal materials including zinc, solder, copper, silver plate and the like. By cross hatching of FIG. 1 illustrates the portions of the coated wires 29*a* and 29*b* on which the conductive layers 34*a* and 34*b* are formed. Capacitors were formed by the aforesaid conductive wires 2*a* and 2*b*, coatings 33*a* and 33*b*, and conductive layers 34*a* and 34*b*.

Figure 2A:
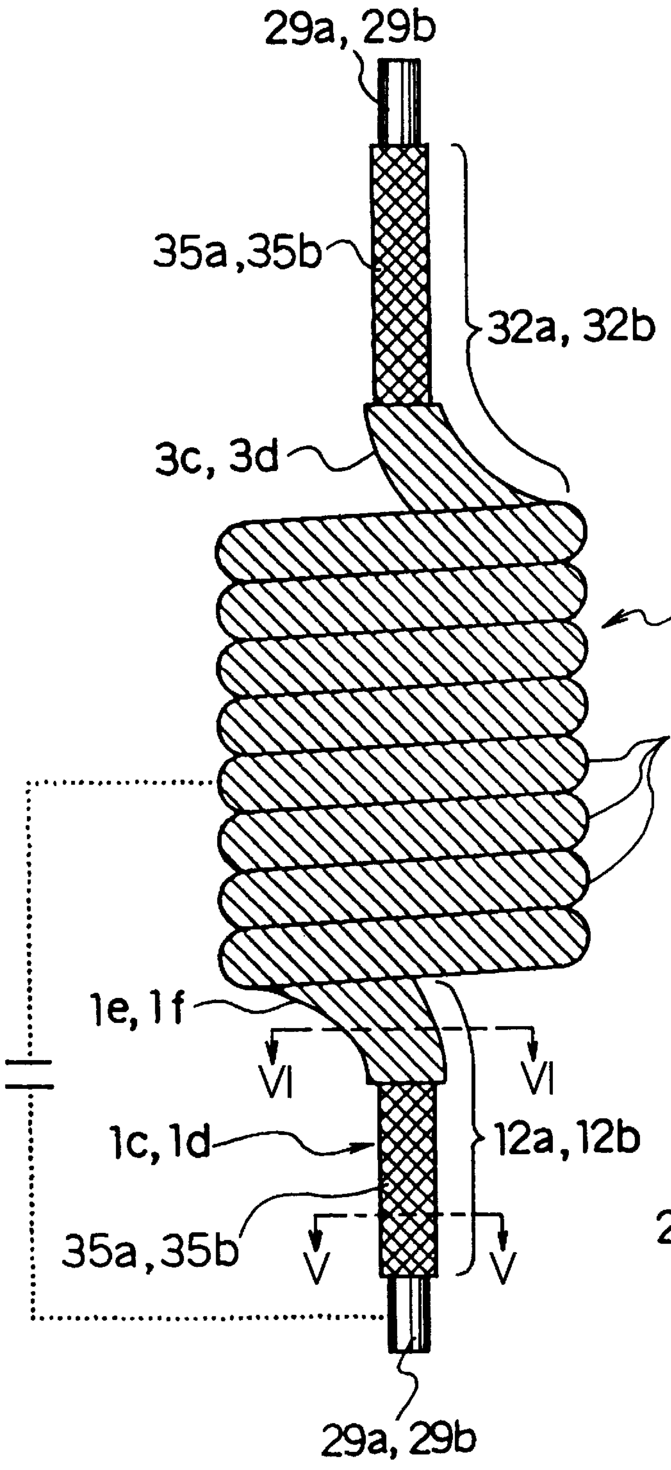
FIG. 2A is a top plan view illustrating a coil portion of the high voltage noise filter of the invention.
Figure 2B:
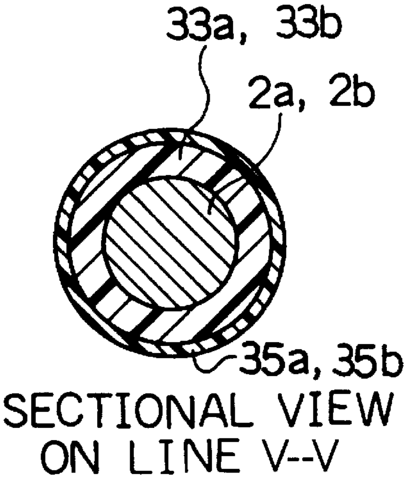
FIG. 2B is a sectional view taken on the line V—V of FIG. 2A.
Figure 2C:
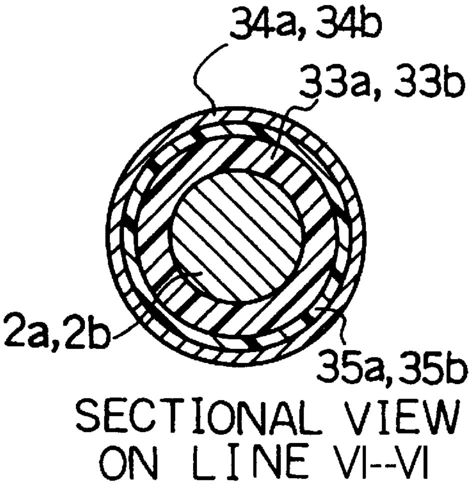
FIG. 2C is a sectional view taken on the line VI—VI of FIG. 2A.

FIG. 2A is a side elevation view of the coil portion 3*b* shown in FIG. 1. The coil portion 3*a* has the same shape and size as the coil portion 3*b* except for that the coil portion 3*a* was wound in the opposite direction (in a symmetrical form) to the coil portion 3*b*. Accordingly, description on FIG. 2A through FIG. 2C illustrating the coil portion 3*b* is similarly applicable to the coil portion 3*a*. Therefore, FIG. 2A through FIG. 2C give reference marks of the components of the coil portion 3*a* accompanied by corresponding reference marks of those of the coil portion 3*b*.

FIG. 2B is a sectional view of terminal portions 1*c* and 1*d* of boundary regions 12*a* and 12*b* taken on the line V—V of FIG. 2A, the terminal portions being continuous to the coated wires 29*a* and 29*b*. As seen in FIG. 2B, the terminal portions 1*c* and 1*d* have double-layered structures, wherein the outer peripheries of the conductive wires 2*a* and 2*b* were coated with the coatings 33*a* and 33*b* of insulating layers. The insulating layers are preferably of fluororesin, but other material such as polyimide resin, silicon resin or the like can be used similarly. The outer peripheries of the coatings 33*a* and 33*b* are covered with high withstand voltage layers 35*a* and 35*b*, respectively.

FIG. 2C is a sectional view of terminal regions 1*e* and 1*f* taken on the line VI—VI of FIG. 2A. In FIG. 2C, the terminal regions 1*e* and 1*f* have triple-layered structures, wherein the outer peripheries of the predetermined part (i.e., part except the end part) of the coatings 33*a* and 33*b* around the conductive wires 2*a* and 2*b* are coated with the high withstand voltage layers 35*a* and 35*b*, and the predetermined part (i.e., except the end part) of the outer peripheries of the high withstand voltage layers were covered with conductive layers 34*a* and 34*b*, respectively.

Across the boundary portions 12*a* and 12*b* including the terminal portions 1*c* and 1*d* shown by crosshatching and the terminal regions 1*e* and 1*f* of the coil portions 3*a* and 3*b* in FIG. 1, the high withstand voltage layers 35*a* and 35*b* were formed on the coatings 33*a* and 33*b* of the coated wires 29*a* and 29*b*, as shown in FIG. 2A, FIG. 2B and FIG. 2C, The high withstand voltage layers 35*a* and 35*b* comprised a semiconductive layer or an insulative layer formed of a resin material such as polyimide, silicone or the like. The semiconductive layer has a midrange electric resistivity between those of the insulating material and conductive material, and preferably, it is in a range from $10^{-4}$ to $10^{6}$ Ωm in electric resistivity. Examples of preferred materials for the semiconductive layer include pyrite, germanium, cuprous oxide, selenium and the like. Such a material is pulverized and mixed with an insulating material so as to be formed into a film or tube. The resultant film or tube is wound around or put on the outer peripheries of the coatings 33*a* and 33*b* of the coated wires 29*a* and 29*b* thereby forming the semiconductive layers as the high withstand voltage layers 35*a* and 35*b*. In case where polyimide resin material is used for the insulative members as the high withstand voltage layers 35*a* and 35*b*, it is practical to wind a polyimide film around the coatings of the coated wires. Alternatively, in the case of using silicone resin material, it is practical to put a silicone tube on the coatings or apply a silicone paste to the coatings of the coated wires.

At the terminal regions 1*e* and 1*f* adjacent to the terminal portions 1*c* and 1*d* of the coil portions 3*a* and 3*b*, the conductive layers 34*a* and 34*b* are formed on the high withstand voltage layers 35*a* and 35*b* by spraying the aforesaid relatively soft metal material, e.g. zinc. Other material as solder or the like also can be used similarly. Thus, the terminal regions have the structures wherein the coatings 33*a* and 33*b* of the coated wires 29*a* and 29*b* are covered with the high withstand voltage layers 35*a* and 35*b*, and they are further coated with the conductive layers 34*a* and 34*b* such as of zinc or solder. The high withstand voltage layers 35*a* and 35*b* are also formed on boundary regions 32*a* and 32*b* extending from the coil portions 3*a* and 3*b* to fastening tabs 7*a* and 7*b*, respectively. Similarly to the terminal regions 1*e* and 1*f*, terminal regions 3*c* and 3*d* at the other ends of the coil portions 3*a* and 3*b* have the triple-layered structures of the coatings 33*a* and 33*b*, the high withstand voltage layers 35*a* and 35*b* and the conductive layers 34*a* and 34*b*, respectively.

In FIG. 1, the conductive layers 34*a* and 34*b* at the respective terminal portions 3*c* and 3*d* of the coil portions 3*a* and 3*b* are connected to grounding plates 9 by means of conductive members 14 such as of solder. The coil portions 3*a* and 3*b* are housed in a resin casing 16*a* shown by sectional form in FIG. 1. The boundary regions 32*a* and 32*b* of the coil portions 3*a* and 3*b* are housed in a resin casing 16*b* also shown by sectional form in FIG. 1. Terminals 12*e* and 12*f* of the coil portions 3*a* and 3*b* are connected to the respective fastening tabs 7*a* and 7*b* extending through the resin casing 16*b* to project outward of the casing 16*b*. The interior of the resin casings 16*a* and 16*b* is filled with an insulating resin material 11, such as an epoxy resin. Consequently, portions from the terminal portions 1*c* and 1*d* to the joints between the terminals 12*e* and 12*f* and the fastening tabs 7*a* and 7*b* are enclosed by the insulating resin 11.

According to the present invention, the terminal regions 1*e* and 1*f* as well as 3*c* and 3*d* of the coil portions 3*a* and 3*b* are made to the aforesaid triple-layered structure because the terminal regions 1*e*, 1*f*, 3*c* and 3*d* are places most likely to produce the electric field concentration and hence, are most susceptible to the insulation breakdown.

Figure 3A:
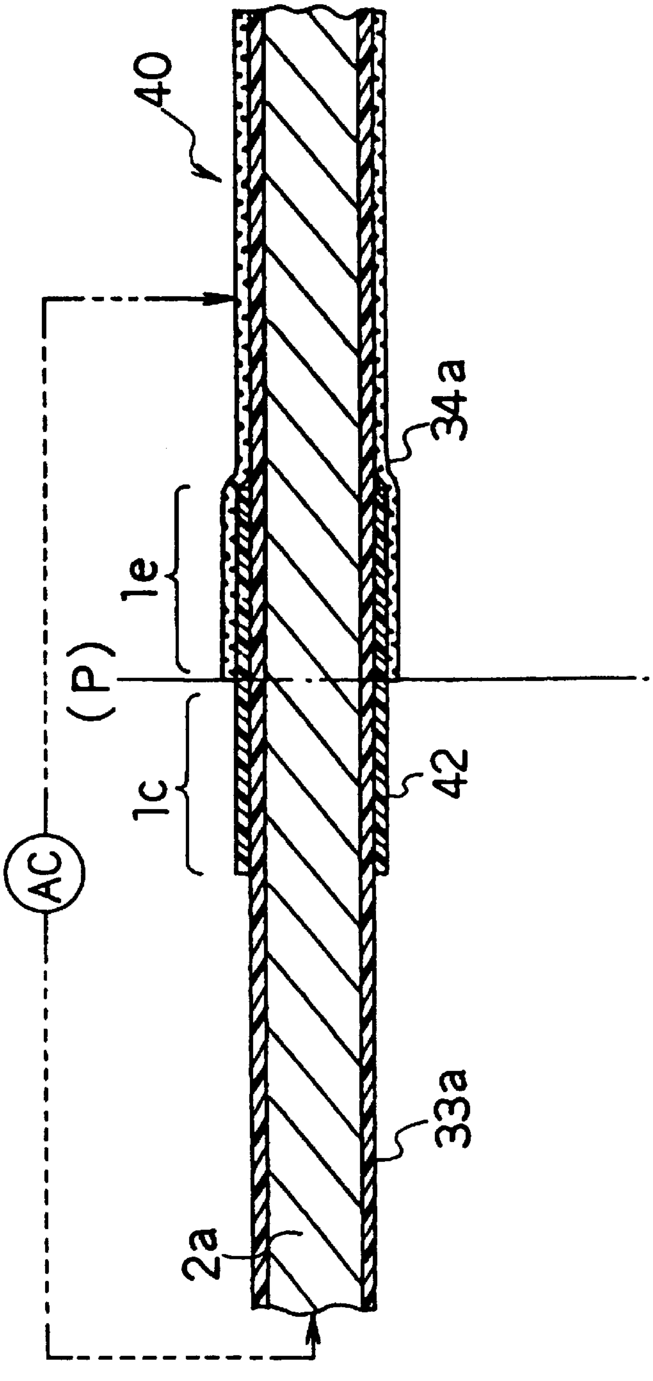
FIG. 3A is a sectional view illustrating a wire material for the high voltage noise filter of the invention.
Figure 3B:
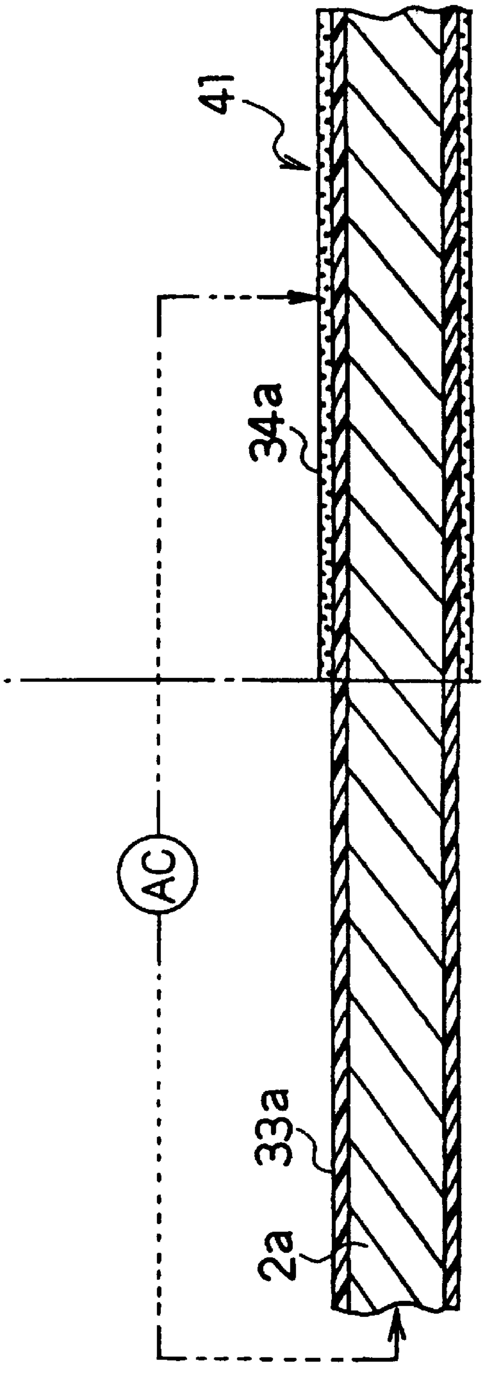
FIG. 3B (PRIOR ART)
FIG. 3B is a sectional view illustrating the wire material for the conventional high voltage noise filter.
Figure 4:
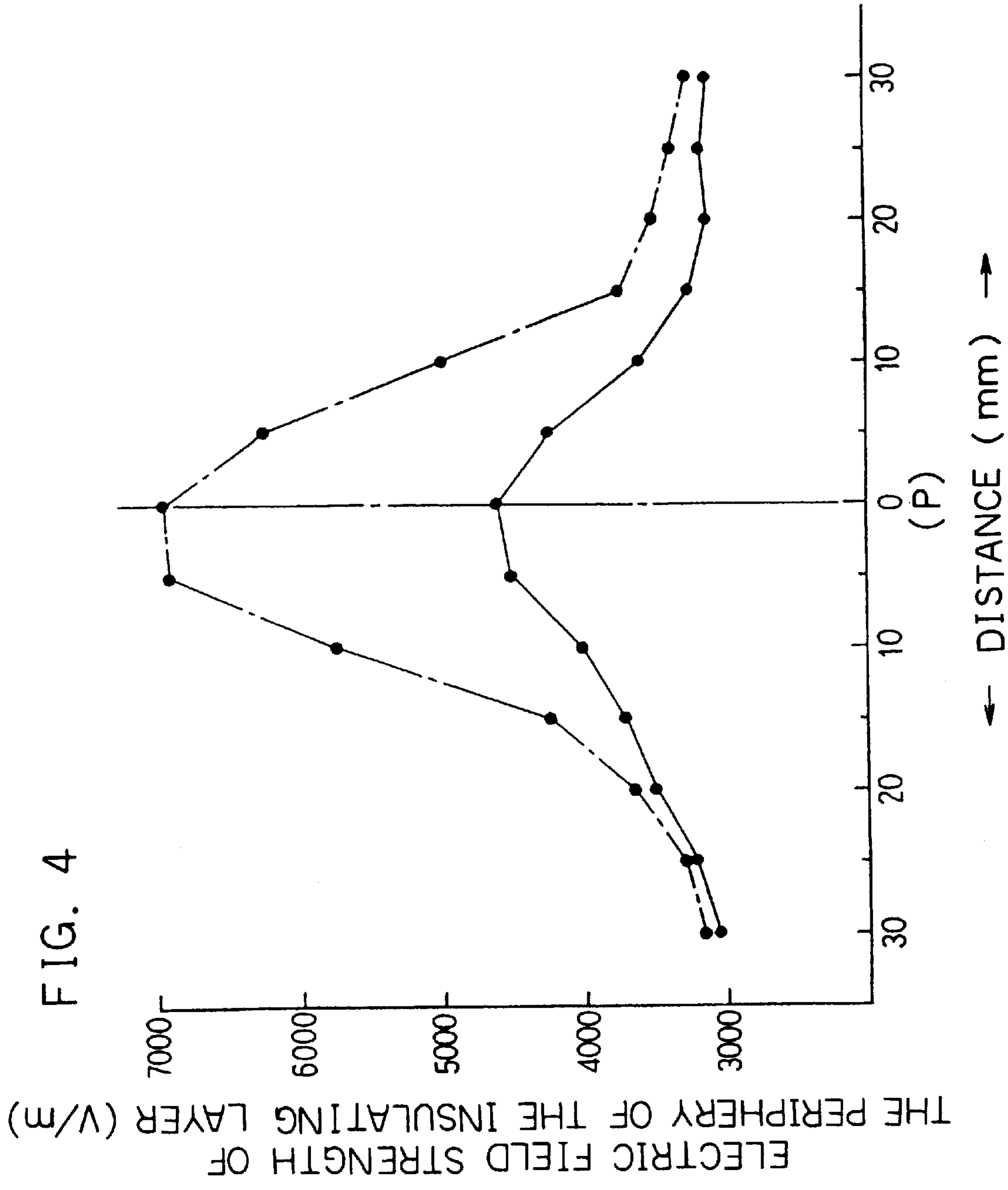
FIG. 4 is a graphical representation of the distribution of field strengths of the respective outer peripheral surfaces of the wire materials shown in FIG. 3A and FIG. 3B.

FIG. 4 shows the results of a comparison between a wire material 40 of FIG. 3A according to the invention and a conventional wire material 41 of FIG. 3B having the double-layered structure. The wire materials extended in straight lines. The wire material 40 is used for the invention wherein the coil portions 3*a* and 3*b* have the triple-layered structures at the terminal regions 1*e*. In the wire material 40 of FIG. 3A, a 0.3 mm thick fluororesin coating 33*a* is formed on the outer periphery of a copper conductive material 2*a* having a diameter of 1.4 mm. On the outer periphery of the coating 33*a*, a 0.2 mm thick polyimide film 42 is formed as the high withstand voltage layer 35*a* within a range of 20 mm along the length of the wire with a central line P extending through the middle of the 20 mm range. In addition, a 0.1 mm thick solder layer is formed as the conductive layer 34*a* in a region extending rightward of the central line P. The test produced a favorable result that a polyimide film of about 20 mm length contributes to improve withstand voltage characteristics of the insulative layer.

On the other hand, the conventional wire material 41 shown in FIG. 3B comprises the conductive layer 34*a* formed in the region rightward of the central line P, but does not include the polyimide film 42 as the high withstand voltage layer. The other parts of the wire material 41 are fabricated in the same manner as those of the wire material 40 shown in FIG. 3A.

As to the wire materials 40 and 41 shown in FIG. 3A and FIG. 3B, a field strength of the outer peripheral surface of the coating 33*a* was calculated by way of the finite-element method on the assumption that an AC voltage of from 3000 to 7000 V was applied across the conductive material 2*a* and the conductive layer 34*a*. FIG. 4 graphically represents the calculation results. In FIG. 4, the numerals on the abscissa indicate the lateral distances along the wire materials 40 and 41 from the central line P indicative of the zero (middle) point. The numerals on the ordinate indicate the calculation values of the field strength The wire material 40 of the invention shown by the solid line in FIG. 4 presents a field strength of about 4600 V/m for the central point P and a field strength of about 3100 V/m for lateral points 30 mm from the central point P. In contrast, the conventional wire material 41 shown by the dot-and-dash line presents a field strength of about 7000 V/m for the central point P and a field strength of about 3200 V/m for lateral points 30 mm from the central point P, which 3200 V/m does not give a significant difference from the corresponding field strength of the wire material 40. As apparent from the graph, the field strength in the vicinity of the central point P where the field strength reaches the peak value is much smaller in the wire material 40 of the invention than in the conventional wire material 41. It is to be understood that the wire material 40 of the invention notably reduces the electric field concentration.

Figure 5:
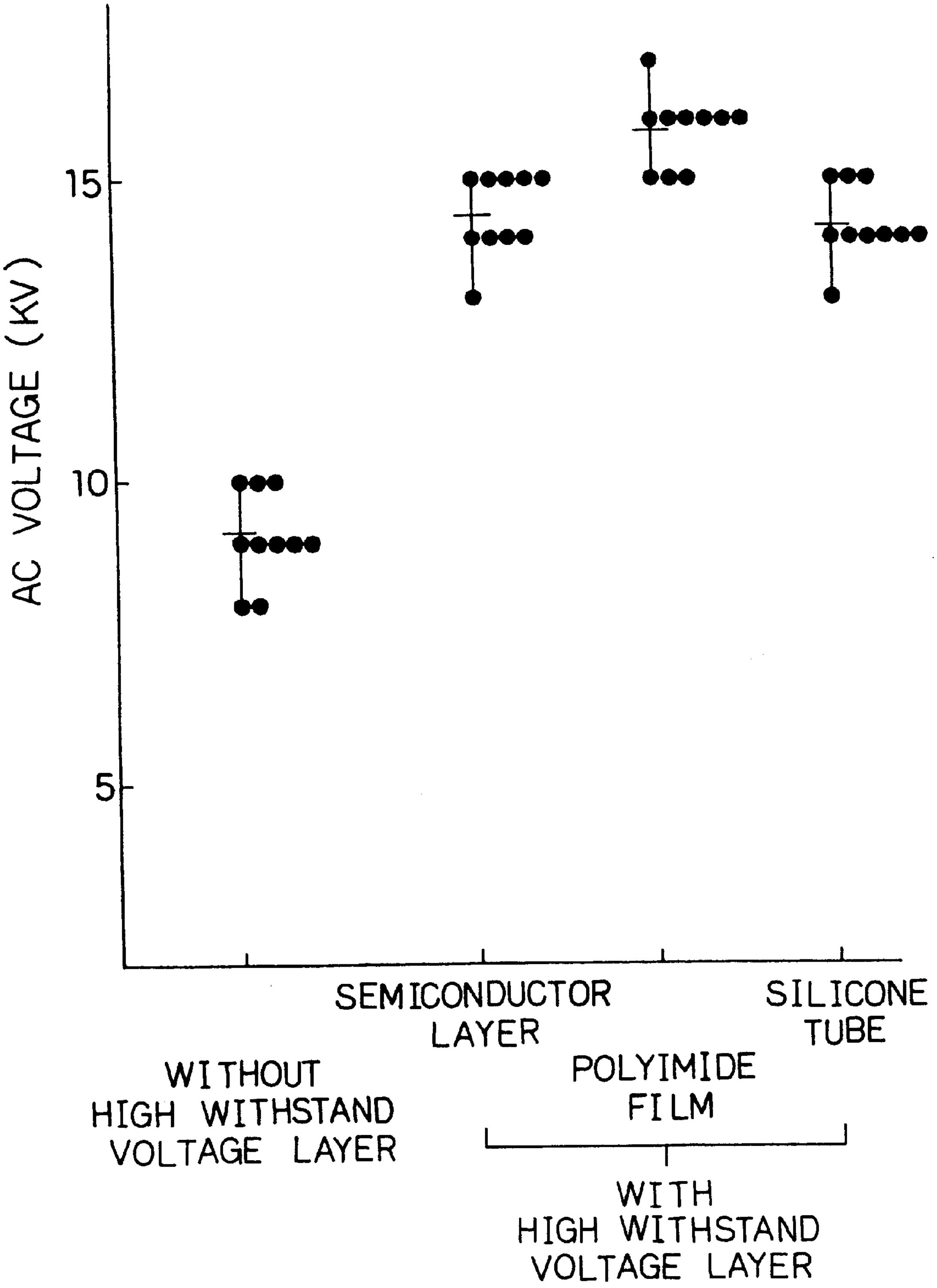
FIG. 5 is a graphical representation of the electric strength characteristics of the high voltage noise filter of the invention and the conventional high voltage noise filter.

The following test was conducted on the high voltage noise filter according to the embodiment hereof shown in FIG. 1. The conductive wires 2*a* and 2*b*, coatings 33*a* and 33*b*, high withstand voltage layers 35*a* and 35*b*, and conductive layers 34*a* end 34*b* of FIG. 2C were constructed in the same manner as those shown in FIG. 3A. In FIG. 1, a high voltage generating device 15 was connected across the fastening tabs 7*a* and 7*b* and the grounding plates 9 for applying AC voltage of from 5 kV to 18 kV. The test was conducted on the basis of ten samples, each ten samples including, as the high withstand voltage layers 35*a* and 35*b*, a semiconductive layer, polyimide film or silicone tube. FIG. 5 graphically represents measurements of voltage at which the coatings 33*a* and 33*b* produced insulation breakdown. In FIG. 5, dots indicate the insulation breakdown voltages (kV) of individual samples. A short lateral line intersecting the vertical line interconnecting the dots indicate the mean value of insulation breakdown voltages of each sample group. All the ten samples of the conventional noise filters without the high withstand voltage layers 35*a* and 35*b*, shown in FIG. 5, produced the insulation breakdown at voltages of from 7 to 10 kV, the mean value of which voltages was about 9 kV. As to the samples of the embodiment hereof including the semiconductive layer as the high withstand voltage layer, the mean value of the insulation breakdown voltages was about 14 kV. The samples including the polyimide film and the silicone tube presented the mean insulation breakdown voltages of 16 kV and 14 kV, respectively It is to be understood from the above results that the high voltage noise filters according to the embodiment hereof have achieved more than 50% increase in the insulation breakdown voltage from that of the conventional high voltage noise filter. The high voltage noise filter employing the polyimide film, in particular, has achieved a significant improvement in the withstand voltage characteristics, achieving more than 70% increase in the insulation breakdown voltage.

Second Embodiment

Figure 6:
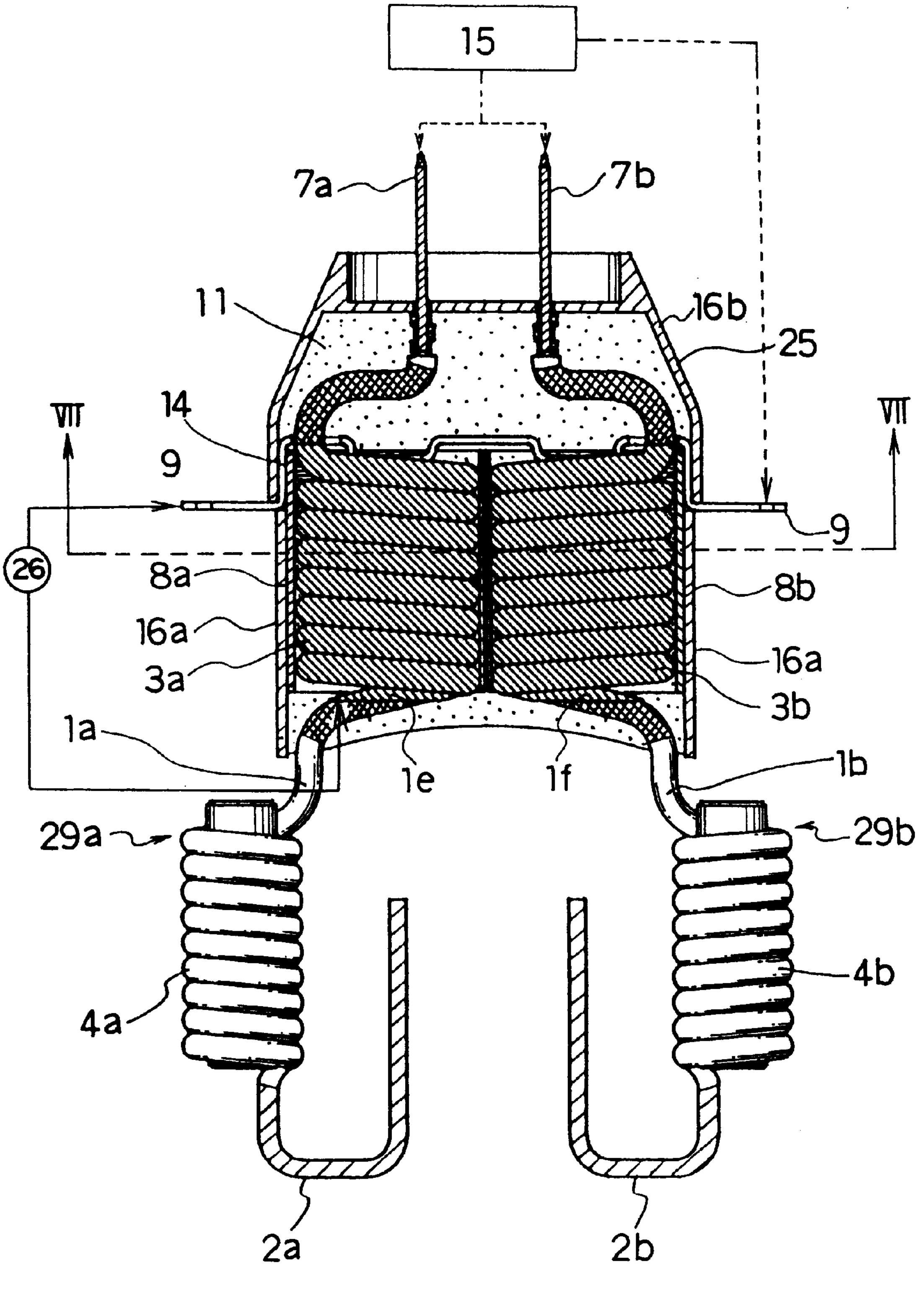
FIG. 6 is a top plan view illustrating a relevant portion of a high voltage noise filter in accordance with a second embodiment hereof.
Figure 7:
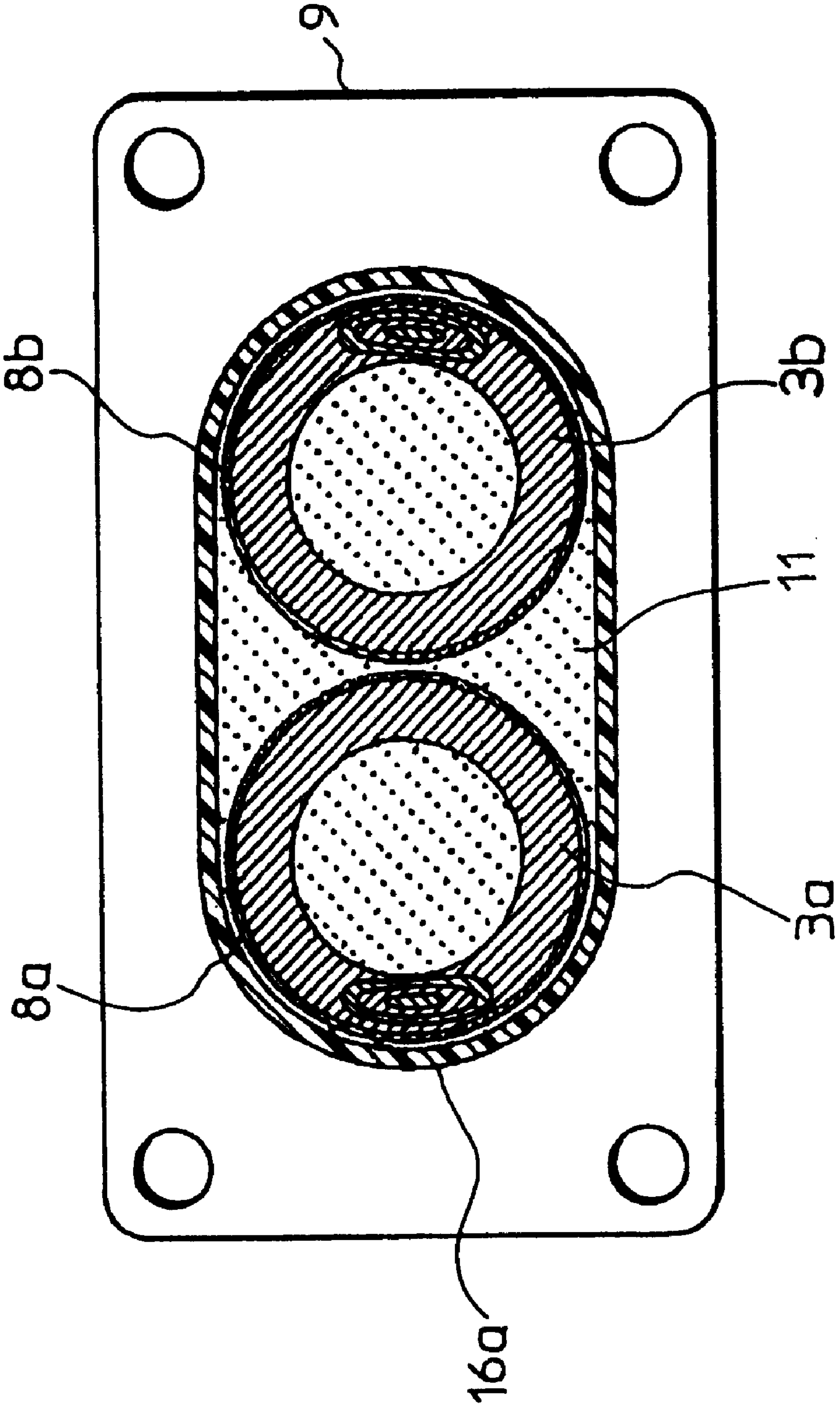
FIG. 7 is a sectional view taken on the line VII—VII of FIG. 6.

FIG. 6 is a top plan view of a high voltage noise filter according to a second embodiment hereof. In FIG. 6, the choke coils 4*a* and 4*b* and coil portions 3*a* and 3*b* are constructed in the same manner as the first embodiment shown in FIG. 1. The second embodiment differs from the first embodiment in that the coil portions 3*a* and 3*b* are accommodated in cylindrical conductive members 8*a* and 8*b*, respectively FIG. 7 is a sectional view taken on the line VII—VII of FIG. 6. As seen in FIG. 7, the coil portions 3*a* and 3*b* are accommodated in the respective conductive members 8*a* and 8*b* so as to keep intimate contact with the interior walls of the respective conductive members 8*a* and 8*b*. Accordingly, the conductive layers 34*a* and 34*b* formed of a relatively soft metal on the outer peripheries of the coil portions 3*a* and 3*b* provide sufficient contact with the interior walls of the conductive members 8*a* and 8*b* by virtue of the softness of the conductive layers, thereby establishing good electric connection with the conductive members. In FIG. 1, the conductive members 8*a* and 8*b* along with the conductive layers 34*a* and 34*b* of the coil portions 3*a* and 3*b* are electrically connected to the grounding plates 9 at the terminal regions 3*c* and 3*d* by means of the conductive member 14 such as solder. As seen in FIG. 6 and FIG. 7, the cylindrical conductive members 8*a* and 8*b* accommodating the coil portions 3*a* and 3*b*, respectively, are housed in the resin casings 16*a* and 16*b* so that the insulating resin material 11 is molded to the coil portions and conductive members in a similar manner to the first embodiment.

Figure 8:
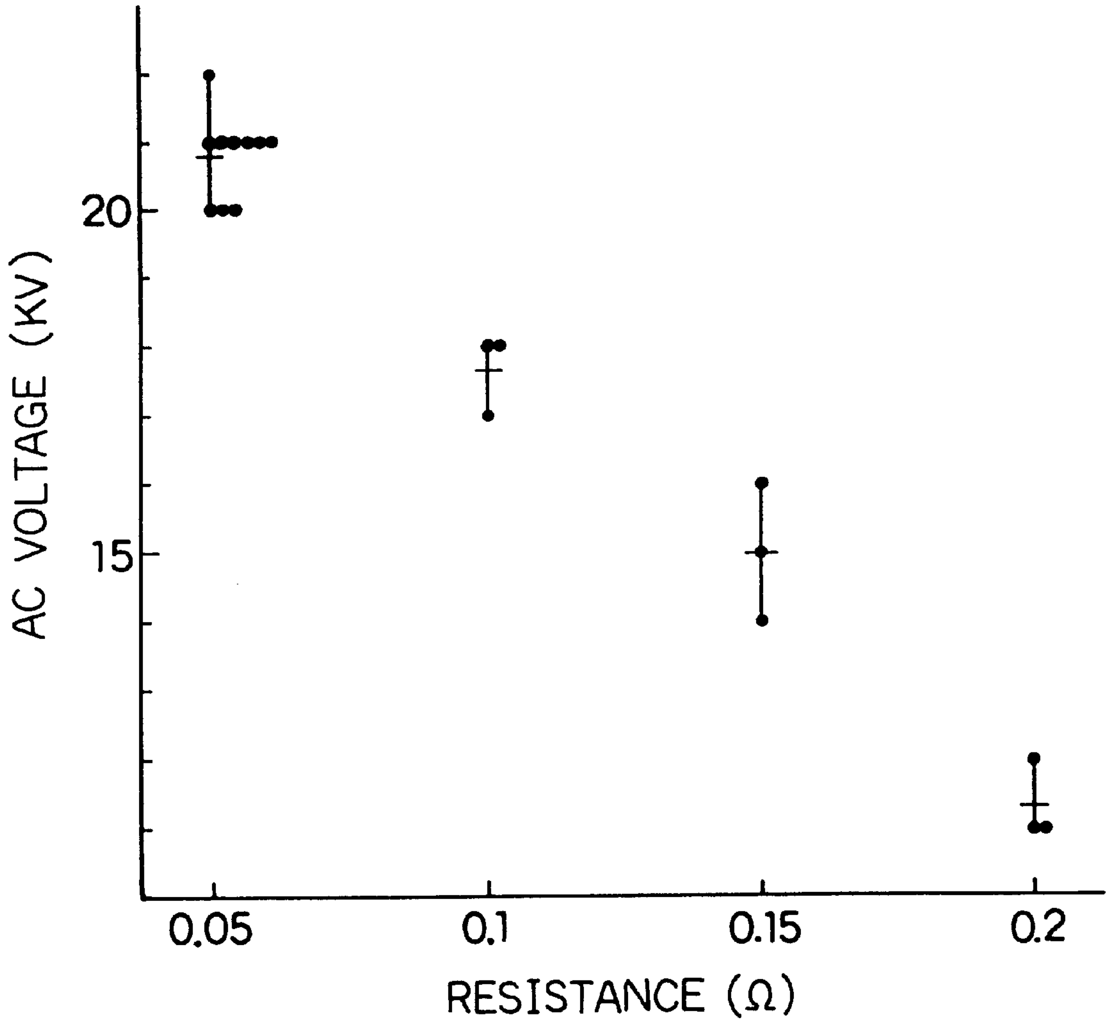
FIG. 8 is a graphical representation of the relationship between an electric resistance and a withstand voltage of the high voltage noise filter of the invention.

Similarly to the first embodiment hereof, the high voltage noise filter according to the second embodiment was subjected to a test. A high AC voltage was applied across the fastening tabs 7*a* and 7*b* and the grounding plates 9, respectively, by means of the high voltage generating device 15 for measurement of the insulation breakdown voltage of the coatings 33*a* and 33*b* of the coated wires 29*a* and 29*b*. FIG. 8 graphically represents the measurement results. In the figure, an electric resistance was plotted as abscissa, the electric resistance measured by means of electric resistance meters 26 connected, as shown in FIG. 6, across the grounding plate 9 and the terminal regions 1*e* and 1*f* of the coil portions 3*a* and 3*b*. The first embodiment presented the electric resistance of from 0.15 to 0.2Ω whereas the second embodiment presented much smaller electric resistance of from 0.05 to 0.1Ω. This is because the conductive layers 34*a* and 34*b* of the coil portions 3*a* and 3*b* contact the interior walls of the cylindrical conductive members 8*a* and 8*b* at multiple contacting portions. In FIG. 8, the voltages of the high voltage generating device 15 was plotted as ordinate. The measurement results indicate that the insulation breakdown occurred at voltages of from 11 to 16 kV in the first embodiment, whereas the insulation breakdown occurred at voltages of from 17 to 22 kV in the second embodiment. Thus, the second embodiment has achieved much greater improvement in the withstand voltage characteristics than the first embodiment. The smaller electric resistance means the greater improvement in the withstand voltage characteristics. This holds for the following reason. The potential of the conductive layers 34*a* and 34*b* decrease with reduction of the electric resistance due to contact between the conductive layers 34*a* and 34*b* formed of a soft metal and the interior walls of the conductive members 8*a* and 8*b* at multiple contacting portions. The decreased potential of the conductive layers also results in decrease in the potential of the terminal regions 1*e* and 1*f* which tend to produce the electric field concentration. This further leads to the reduction of the electric field concentration, resulting in the improvement of the withstand voltage characteristics.

Third Embodiment

Figure 9:
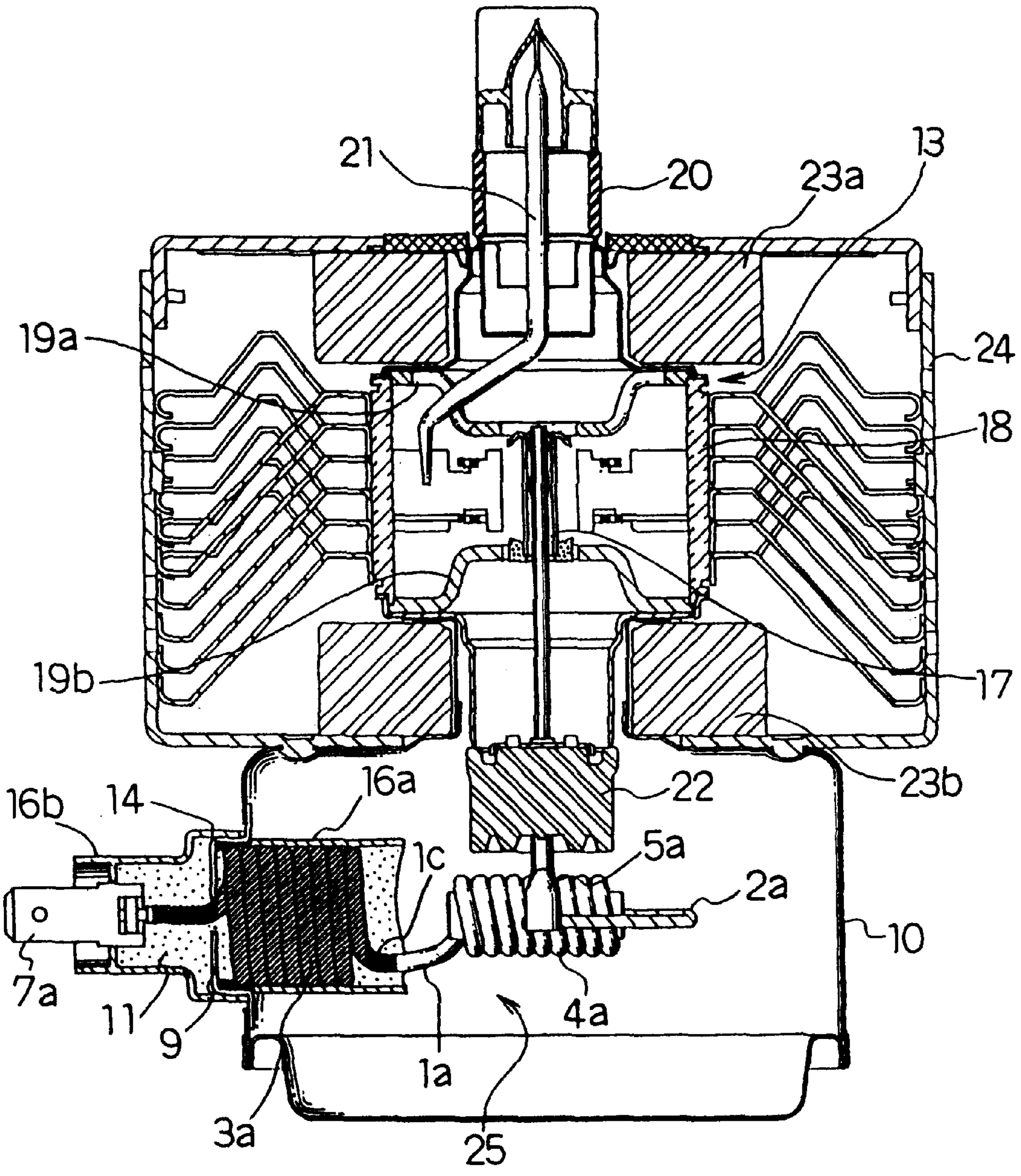
FIG. 9 is a front view in section illustrating a magnetron device in accordance with a third embodiment hereof, the device incorporating the high voltage noise filter of the invention.
Figure 10:
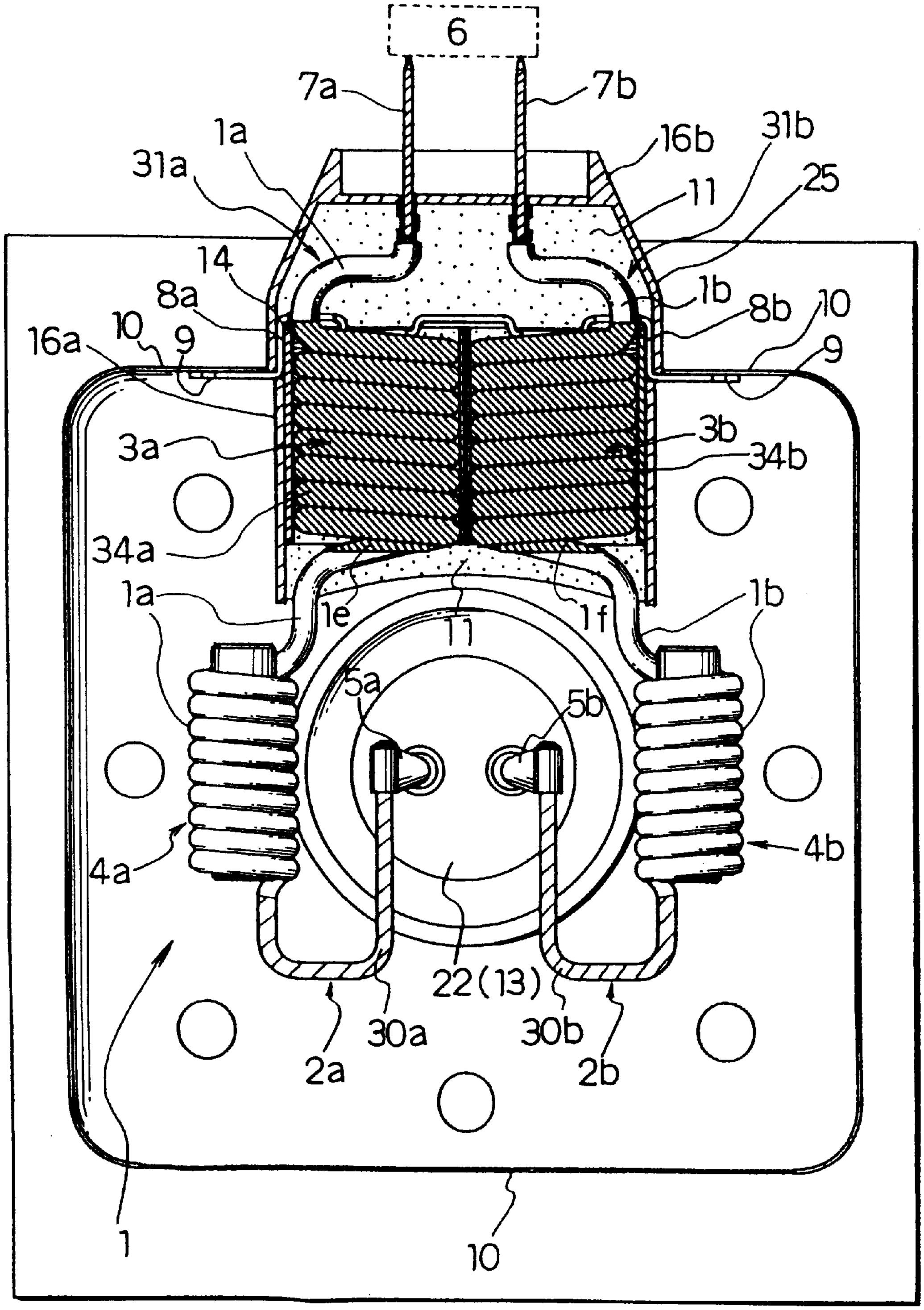
FIG. 10 (PRIOR ART)
FIG. 10 is the sectional view illustrating the relevant portion of the magnetron device incorporating the conventional high voltage noise filter.

A third embodiment is shown in FIG. 9, which is a sectional view of a magnetron device incorporating a high voltage noise filter 25 of the first embodiment of the invention. In the magnetron device of this embodiment, a magnetron 13 comprises a spiral cathode 17 such as formed of thoriated-tungsten, a cylindrical anode 18 such as formed of copper, a pair of pole pieces 19*a* and 19*b* formed of a magnetic material such as iron, a ceramic support 20, an antenna 21 for emission of microwave, and a stem 22 including stem terminals 5*a* and 5*b*. There is further provided an external magnetic circuit portion including permanent magnets 23*a* and 23*b* for producing a magnetic field externally of the magnetron portion 13, and yokes 24. The yokes 24 are provided with a filter case 10 such as formed of a conductive material. The filter case 10 accommodates the high voltage noise filter 25 according to the first embodiment. The high voltage noise filter 25 has the conductive wires 2*a* and 2*b* connected with the stem terminals 5*a* and 5*b*, respectively. FIG. 9 is a sectional view, showing only one of the two choke coils 4*a* and 4*b* and coil portions 3*a* and 3*b* which are vertically disposed with respect to the plane of the figure. The high voltage noise filter 25 of the first embodiment may be replaced by that of the second embodiment. By employment of the high voltage noise filter of the first or second embodiment featuring excellent withstand voltage characteristics, the magnetron device according to the embodiment hereof can accomplish excellent withstand voltage characteristics and a long service life.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

We claim:

1. A high voltage noise filter comprising:

a coil-shaped conductive wire for producing an inductive component of an impedance, the coil-shaped conductive wire having opposing ends;

an insulating layer for producing a capacitive component of the impedance formed on the surface of said conductive wire;

a conductive layer formed on a part of said insulating layer, wherein said conductive layer includes a central portion; and discrete high withstand voltage layers of at least one of a semiconductor and insulator are formed at least in a vicinity region of each of the opposing ends of said conductive wire so that, at each of the opposing ends, at least a part of each of said discrete high withstand voltage layers is interposed between a portion of an outer peripheral surface of said insulating layer and a portion of said conductive layer, wherein only said insulating layer is formed between said conductive wire and said conductive layer in at least some of the central portion.

2. A high voltage noise filter in accordance with claim 1, wherein:

the coil-shaped conductive wire having said insulating layer and said conductive layer is secured by accommodation in a cylindrical conductive member.

3. A high voltage noise filter in accordance with claim 1, wherein said at least one of a semiconductor and insulator has an electric resistivity of from $10^{-4}$ to $10^{6}$ ΩM.

4. A high voltage noise filter in accordance with claim 1, wherein said at least one of a semiconductor and insulator comprises a polyimide resin material.

5. A high voltage noise filter in accordance with claim 1, wherein said at least one of a semiconductor and insulator comprises a silicone resin material.

6. A magnetron device including a high voltage noise filter comprising a coil-shaped conductive wire for producing an inductive component of an impedance, an insulating layer for producing a capacitive component of the impedance formed on the surface of said conductive wire, a conductive layer formed on a part of said insulating layer, and discrete high withstand voltage layers of at least one of a semiconductor and insulator formed only in a vicinity region of end portions of said conductive layer so that at least a part of each of the discrete high voltage withstand layers is interposed between a portion of an outer peripheral surface of said insulating layer and a portion of said conductive layer.

7. A magnetron device in accordance with claim 6, comprising a high voltage noise filter wherein the coil-shaped conductive wire having said insulating layer and conductive layer is accommodated and secured in a cylindrical conductive member.

8. A noise filter, comprising:

a coil-shaped conductive wire for producing an inductive component of an impedance;

an insulating layer for producing a capacitive component of the impedance formed on the surface of said conductive wire;

a conductive layer formed on a part of said insulating layer; and a high withstand voltage layer formed in a vicinity region of an end portion of said conductive layer so that at least a part thereof is interposed between an outer peripheral surface of said insulating layer and said conductive layer and wherein a portion of the outer peripheral surface of said insulating layer physically contacts said conductive layer.

9. A noise filter in accordance with claim 8, wherein:

the coil-shaped conductive wire has a length and said conductive layer physically contacts a conductive member along substantially the entire length of said coil-shaped conductive wire and wherein the conductive member is electrically connected to ground to lower a potential of the conductive layer.

10. A noise filter in accordance with claim 8, wherein the magnitude of the capacitive component is different along the length of the conductive layer.

11. A noise filter, comprising:

a coil-shaped conductive wire for producing an inductive component of an impedance;

an insulating layer for producing a capacitive component of the impedance formed on the surface of said conductive wire;

a conductive layer formed on a part of said insulating layer, the conductive layer extending a length of the coil-shaped conductive wire; and a high withstand voltage layer of at least one of a semiconductor or insulator formed at least in the vicinity region of an end portion of said conductive layer so that at least a part thereof is interposed between an outer peripheral surface of said insulating layer and said conductive layer, wherein a magnitude of said capacitive component is different at the vicinity region of the end portion of said conductive layer then at the remainder of the coil-shaped conductive wire.

12. A noise filter in accordance with claim 8, wherein a first capacitance is defined by the conductive layer and the coil-shaped conductive wire where the high withstand voltage layer is located and a second capacitance is defined by the conductive layer and the coil-shaped conductive wire where the portion of the outer peripheral surface of said insulating layer physically contacts the conductive layer, and the first capacitance is different than the second capacitance.

13. A noise filter in accordance with claim 1, wherein at least one of a semiconductor and insulator includes a semiconductive material and the semiconductive material has an electric resistivity that is more than a resistivity of the conductive layer and less than a resistivity of the insulating layer.

14. A noise filter in accordance with claim 11, wherein the high withstand voltage layer has a composition that is different from a composition of the insulating layer.

15. A high voltage noise filter in accordance with claim 1 wherein the insulating layer and the discrete high withstand voltage layer are composed of different materials.

* * * * *